United States Patent [19]

Murata et al.

[11] Patent Number: 5,390,186
[45] Date of Patent: Feb. 14, 1995

[54] METHOD OF FAULT HANDLING FOR A DISK CONTROL UNIT WITH BUILT-IN CACHE

[75] Inventors: Tomohiro Murata; Masaharu Akatsu, both of Yokohama; Kenzo Kurihara, Tokyo; Shigeo Homma, Odawara; Akira Yamamoto, Sagamihara, all of Japan

[73] Assignee: Hitachi, Ltd., Tokyo, Japan

[21] Appl. No.: 615,929

[22] Filed: Nov. 20, 1990

[30] Foreign Application Priority Data

Nov. 22, 1989 [JP] Japan .................................. 1-303967

[51] Int. Cl.6 .......................... G06F 11/00; G06F 1/00
[52] U.S. Cl. ................. 371/10.1; 364/245.3; 364/268.5; 364/964.34; 364/969
[58] Field of Search ..................... 371/10.1; 364/245.3, 364/243.4, 268.5, 269.2, 440, 964.34, 964.392, 964.391, 268.9, 268.3, 969, 970, 971.1

[56] References Cited

U.S. PATENT DOCUMENTS

| | | | |
|---|---|---|---|
| 3,896,419 | 7/1975 | Lange et al. | 395/250 |
| 4,044,337 | 8/1977 | Hicks et al. | 364/200 |
| 4,357,656 | 11/1982 | Saltz et al. | 364/268.5 |
| 4,819,154 | 4/1989 | Stiffler et al. | 364/268.9 |
| 5,124,987 | 6/1992 | Milligan et al. | 371/10.1 |
| 5,201,041 | 4/1993 | Bohner et al. | 395/425 |

FOREIGN PATENT DOCUMENTS 60-79447 7/1985 Japan .

*Primary Examiner*—Robert W. Beausoliel, Jr.
*Assistant Examiner*—T. Tu
*Attorney, Agent, or Firm*—Fay, Sharpe, Beall, Fagan, Minnich & McKee

[57] ABSTRACT

In order for a disk control unit with built-in cache to write non-reflective data in the cache to a disk drive without stopping extension of a read/write command from host computer in the event of a fault in the cache or its backup memory, the track data in normal one of the cache and its backup memory is written to a certain physical track of the disk drive upon judging at read/write command execution that the accessed track is a non-reflective track, and a read/write command from the host computer is implemented for the physical track of the disk drive which has completed the non-reflective track write operation.

4 Claims, 16 Drawing Sheets

FIG. 4

| BACKUP MEMORY STATE \ CACHE STATE | 0 | 1 | 2 | 3 |
|---|---|---|---|---|
| 0 | (RECOVERY STATUS) 0 0 0 0 | 1 0 0 0 | 1 0 0 1 | 0 0 1 * |
| 1 | 0 1 0 0 | | 1 0 0 1 | 0 0 1 * |
| 2 | 0 1 0 0 | 1 0 0 0 | 1 0 0 1 | 0 0 1 * |
| 3 | 0 1 0 0 | 1 0 0 0 | 1 0 0 1 | 1 1 1 1 |

FIG. 5

| BACKUP MEMORY STATE \ CACHE STATE | 0 (ACCESS LEVEL) | 1 | 2 | 3 |
|---|---|---|---|---|
| 0 | 3 | 1 | 2 | 3 |
| 1 | 2 | 1 | 1 | 1 |
| 2 | 2 | 1 | 1 | 1 |
| 3 | 2 | 1 | 1 | 0 |

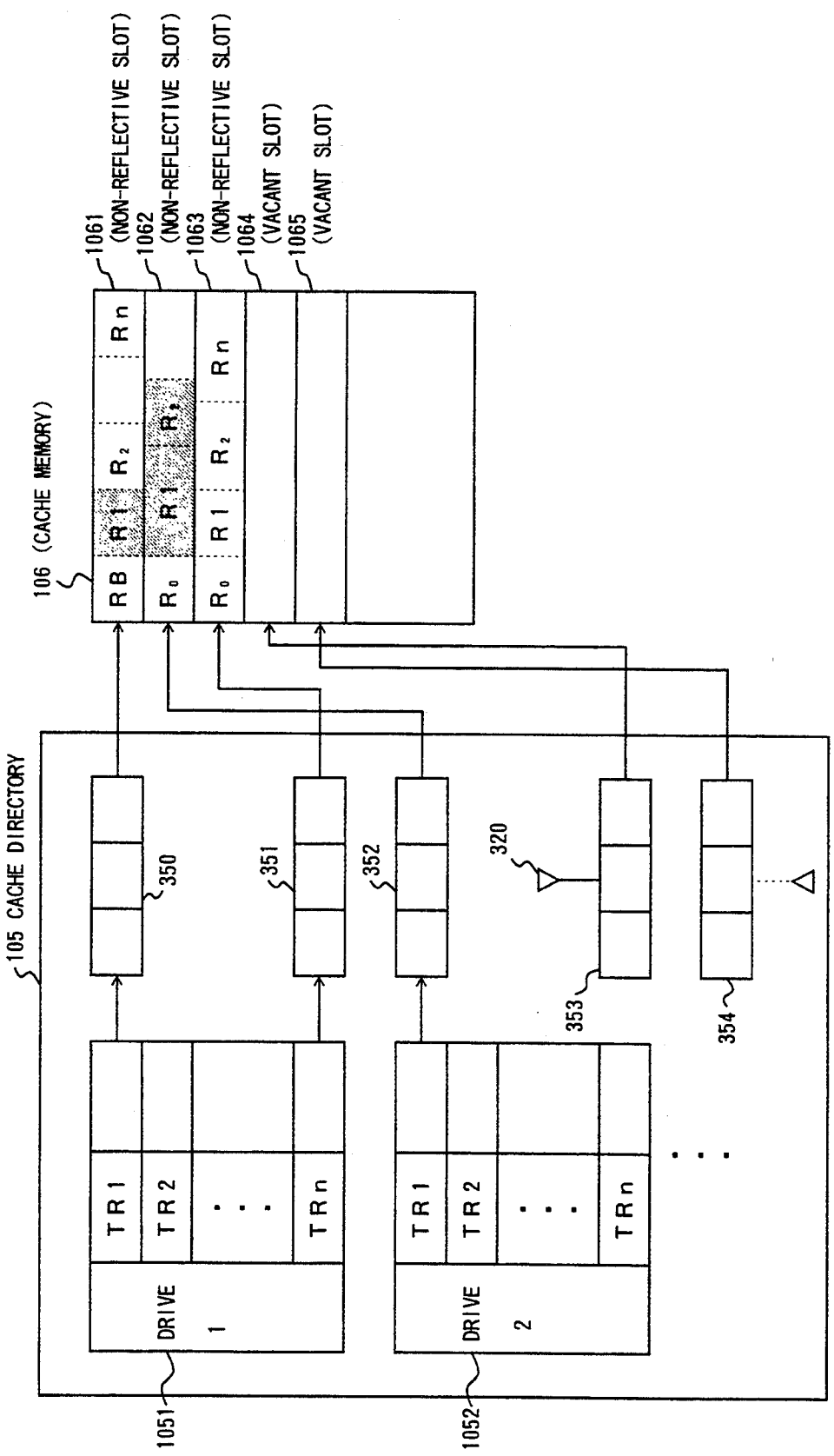

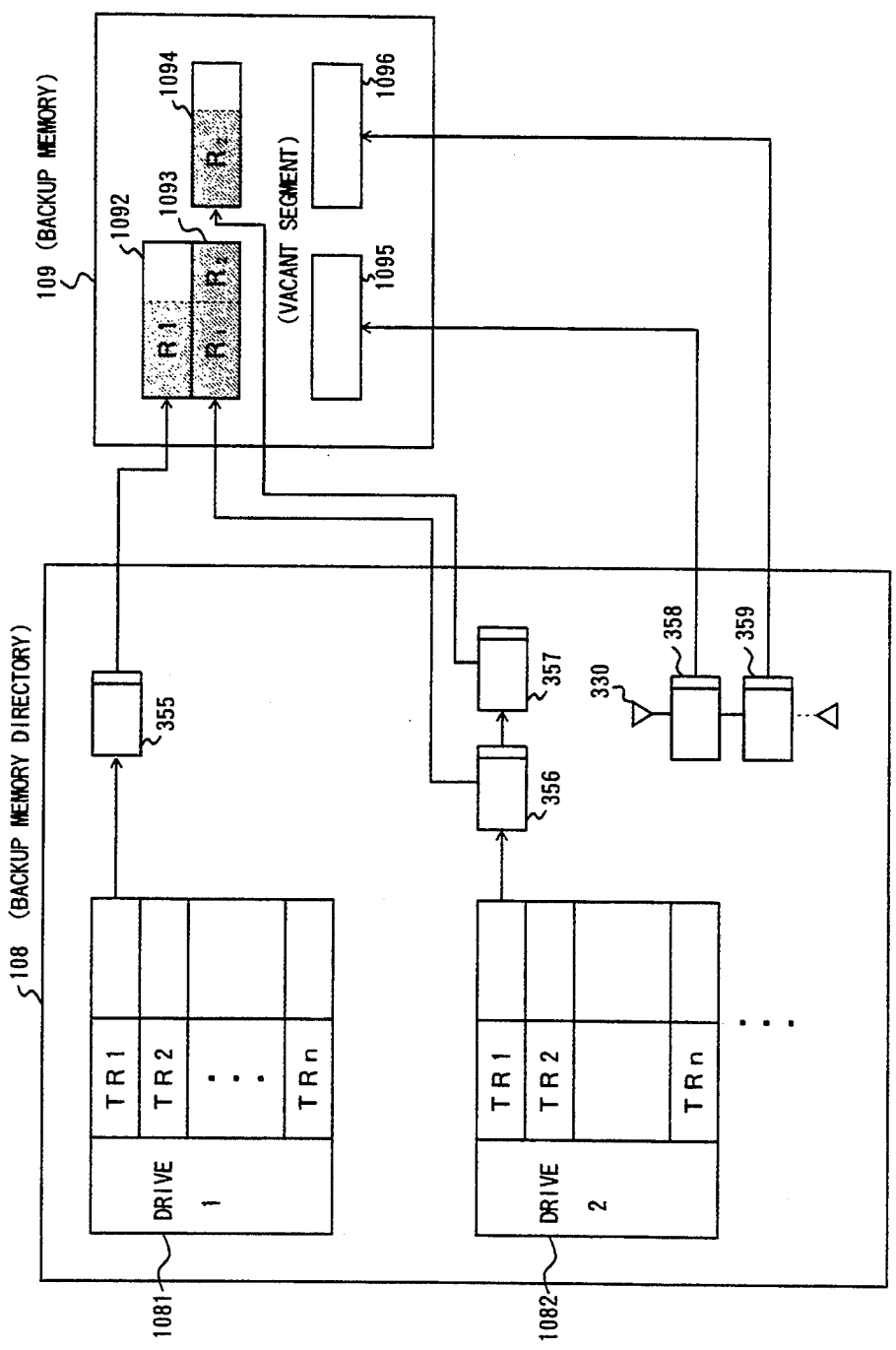

METHOD OF FAULT HANDLING FOR A DISK CONTROL UNIT WITH BUILT-IN CACHE

BACKGROUND OF THE INVENTION

This invention relates to a disk control unit with built-in cache and to a method of performing a fault handling process for the same. Particularly, the invention relates to a method of fault handling process for the cache memory of a disk control unit which operates to cache write-data to be stored on a disk drive from a host computer and stores the cached data on the disk in batch and asynchronously with the disk write operation of the host computer.

A capacious auxiliary memory unit, such as a magnetic disk unit, stores a large quantity of data in one volume. On this account, the number of times of access to a volume per unit time length increases and there is an increasing trend of access concentration to one volume.

A magnetic disk has an access time of the order of several tens milliseconds, which is incomparably longer than the operation time of CPU or the access time of main memory that are of the order of several hundreds nanoseconds, resulting in a degraded efficiency of process of the whole system.

A disk cache system, which is intended to overcome this problem, includes a semiconductor memory (will be termed "cache memory" hereinafter) within the disk control unit, and only data of frequent access is taken out of a magnetic disk drive and stored in the cache memory so that the data in the cache memory is accessed with small overhead thereby to enhance the system performance.

Specifically, a disk control unit with built-in cache has a copy of frequently accessed tracks in its cache memory and when the track is accessed it reads pertinent data out of the cache memory instead of making access to the physical track of the disk, thereby enhancing the data access speed. In consequence, the system response and throughput can be improved without interfering with the program and data organization.

In addition, a disk control unit with inbuilt cache has a function of fault detection for the cache memory.

A conventional disk control unit with inbuilt cache, upon detecting a cache fault, disconnects the whole cache memory, with entire data stored in the cache memory being abandoned, as described in Japanese Patent Unexamined Publication No. 60-79447. The method of cache fault process described in the patent publication 60-79447 is designed to store the same data as on the disk drive in the cache memory and it is useful for a system which makes access to the cache memory only for reading. However, a system which makes access to the cache memory also for writing can not use this method.

Namely, a disk control unit with built-in cache, in which write data from the host computer is held temporarily in the cache memory so that it is stacked as a non-reflective track data which is not consistent with data on the disk drive, instead of being written directly to the disk drive and the non-reflective track data track in the cache memory is written to the disk drive in batch and asynchronously with the disk write operation for the host computer, can not discard data in the cache memory.

On this account, the disk control unit which bases the write operation on the cache memory makes a backup of the cache memory thereby to duplicate the non-reflective track data for safety before writing the non-reflective track data to the disk drive. And, in the event of a fault in the cache memory or backup memory, the non-reflective track data surviving in the normal memory is written to the disk drive.

The write operation for the non-reflective track uses the disk drive exclusively. However, the exclusive use of the disk drive until all non-reflective track data in the cache memory or its backup memory are written to the physical tracks of the disk drive causes the disk read/write request from a high-ranking system to be placed in a long wait status, and this is a serious problem from the viewpoint of operationability of the disk subsystem.

SUMMARY OF THE INVENTION

An object of this invention is to solve the foregoing prior art problem and provide a disk control unit with built-in cache and a method of performing a fault handling process for the unit operative to write cached data to a disk drive without the need of using the disk drive exclusively all through storing non-reflective cached data at the occurrence of a cache fault or backup memory fault, thereby enhancing the reliability and operation-ability of the system.

In order to achieve the above objective, the inventive method implements the following processes.

(1) The process includes a step of detecting a fault, which disrupts the read/write operation, in the cache memory or backup memory, and a step of examining as to whether or not data in the cache memory and backup memory has not yet been written to the physical track of the disk drive and the track of the disk drive is a non-reflective track, i.e., different in contents from the relevant track data of the cache memory and backup memory. On receiving a read/write command for a track of the disk drive from the host computer, if a fault is detected in the cache memory or backup memory by the fault detection step and the accessed track is found to be a non-reflective track by the track status detection step, the track in the cache memory or backup memory, whichever normal, is written to the relevant track of the disk drive and thereafter the read/write command of the host computer is executed for the physical track of the disk drive which has completed the write operation.

(2) If, in the above item (1), the fault detection step has detected that one of the cache memory and backup memory is disabled to read/write, the non-reflective track data of the cache memory and backup memory, which has been found different from the track data of the disk drive by the non-reflective track detection step, is written to the disk drive, regardless of the entry of the read/write command from the host computer.

(3) In the above item (1), the process includes a step of locking non-reflective tracks in the normal memory which have been accessed by the read/write command from the host computer, and a step of locking a disk drive which stores the non-reflective tracks. Throughout the period of the operation-since the detection of non-reflection tracks until they are written to the disk drive as mentioned in the above items (1) and (2), tracks and disk drive pertinent to this operation are locked by implementing the track locking step and disk drive locking step, and these tracks and disk drive as unlocked on completion of the write operation to the disk drive.

(4) In the above items (1) and (2), the process includes a step of parallel execution control for controlling the operation of detecting a non-reflective track and writing it to the disk drive. If it is judged, through the execution of the parallel execution control step, that locking of the track of the above items (1) and (2) and locking of the disk drive implemented by the track locking and disk drive locking steps of the above item (3) do not contend, the operations described in the above items (1) and (2) are implemented in parallel, or if the judgement of contention is made, the lock operation described in the above itme (1) is given the priority.

(5) If the above item (1), a plurality of disk drives in connection are given non-reflective track grant information indicative of the allowance of existence of non-reflective tracks in the cache memory and backup memory, and the operations described in the above items (1) and (2) are implemented only for disk drives having this non-reflective track grant information.

(6) In the above item (3), when the backup memory is normal, the track locking step implements disk drive lock during writing of a non-reflective track in the backup memory to a physical track of that disk drive.

(7) In the above item (1), a command for a non-reflective track in the normal memory (cache or backup) accessed by the read/write command from the host computer is executed only for the normal memory, instead of the physical track on the disk drive.

(8) In the above item (7), after the command from the host computer of making access to a non-reflective track in the normal memory has been executed in the normal memory, the non-reflective track is written to a physical track of the disk drive.

(9) The inventive disk control unit with built-in cache uses at least one of methods of fault handling process described in one of the above items (1) to (8).

In this invention, if one of the cache memory and backup memory which store data of a non-reflective track data has developed a read/write fault by some reason, causing the memory system to be unilateral, the following processes take place.

For a read/write request issued by a high ranking system to a track of one disk drive, it is examined whether the track data exists in the normal memory (cache or backup), and whether or not it is a non-reflective track. In the case of a non-reflective track, data on the track of the normal memory is written to the corresponding physical track on the disk drive, and thereafter the read/write request of the high ranking system is implemented for the physical track.

For tracks which do not have read/write access from the high ranking system, non-reflective tracks are searched in the normal memory, and they are written on the relevant physical tracks on the corresponding disk drive. The number of non-reflective tracks which are locked for the writing to the physical tracks is variable.

If there arises a contention between a lock request for the process of a read/write request issued by the high ranking system to one disk drive and a lock request for the process of a track which is not accessed by the high ranking system, the lock request from the high ranking system is given the priority so that it is not placed in a long wait status. In this manner, the non-reflective track left in a unilateral condition in the memory system can be written safely to the disk drive, while implementing the process for the read/write request from the high ranking system.

BRIEF DESCRIPTION OF THE DRAWINGS

FIG. 4 is a matrix diagram showing the determination condition of the recovery status shown in FIG. 3;

FIG. 5 is a matrix diagram showing the determination condition of the access level shown in FIG. 2;

FIGS. 6A and 6B are diagrams of table showing the contents of the cache directory, cache memory, backup memory directory, and backup memory shown in FIG. 1;

DESCRIPTION OF THE PREFERRED EMBODIMENT

An embodiment of this invention will be described in detail with reference to the drawings.

Figure 1:
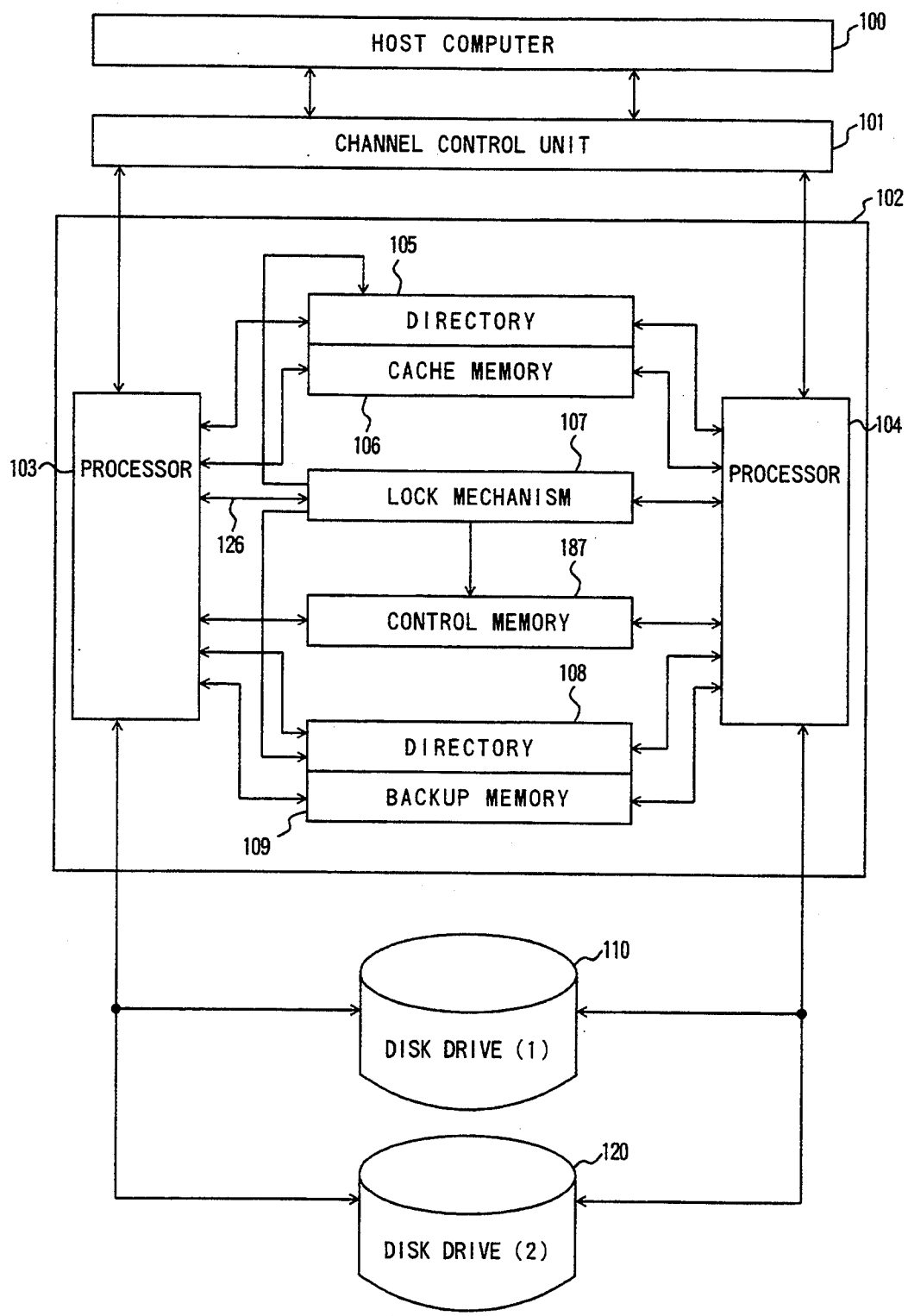
FIG. 1 is a block diagram showing the cache disk subsystem based on an embodiment of this invention.

FIG. 1 is a block diagram of the cache disk subsystem based on an embodiment of this invention. The system comprises a host computer 100, a channel control unit 101, disk control unit 102, and disk drives 110 and 120. The disk control unit 102 incorporates two processors 103 and 104, which are connected with the channel control unit 101 and the disk drives 110 and 120. The processors 103 and 104 are further connected with a lock mechanism 107 for processor arbitration, a cache memory 106, a cache directory 105 for storing control information of the cache memory 106, a backup memory 109 for the cache, a directory 108 for storing control information of the backup memory 109, and a control memory 187 which reflects the states of the cache memory 106, backup memory 109 and disk drives.

In the event of a fault in one of the cache memory 106 and backup memory 109, the disk control unit 102 stores the non-reflective track in the normal memory (cache or backup) to the disk drives 110 and 120, and thereafter lets the host computer 100 have direct access to the disk drives 110 and 120, without implementing the write control to the cache. The operation of the disk control unit 102 will be explained in more detail following the explanation of the tables shown in FIGS. 2 to 9.

Figure 2:
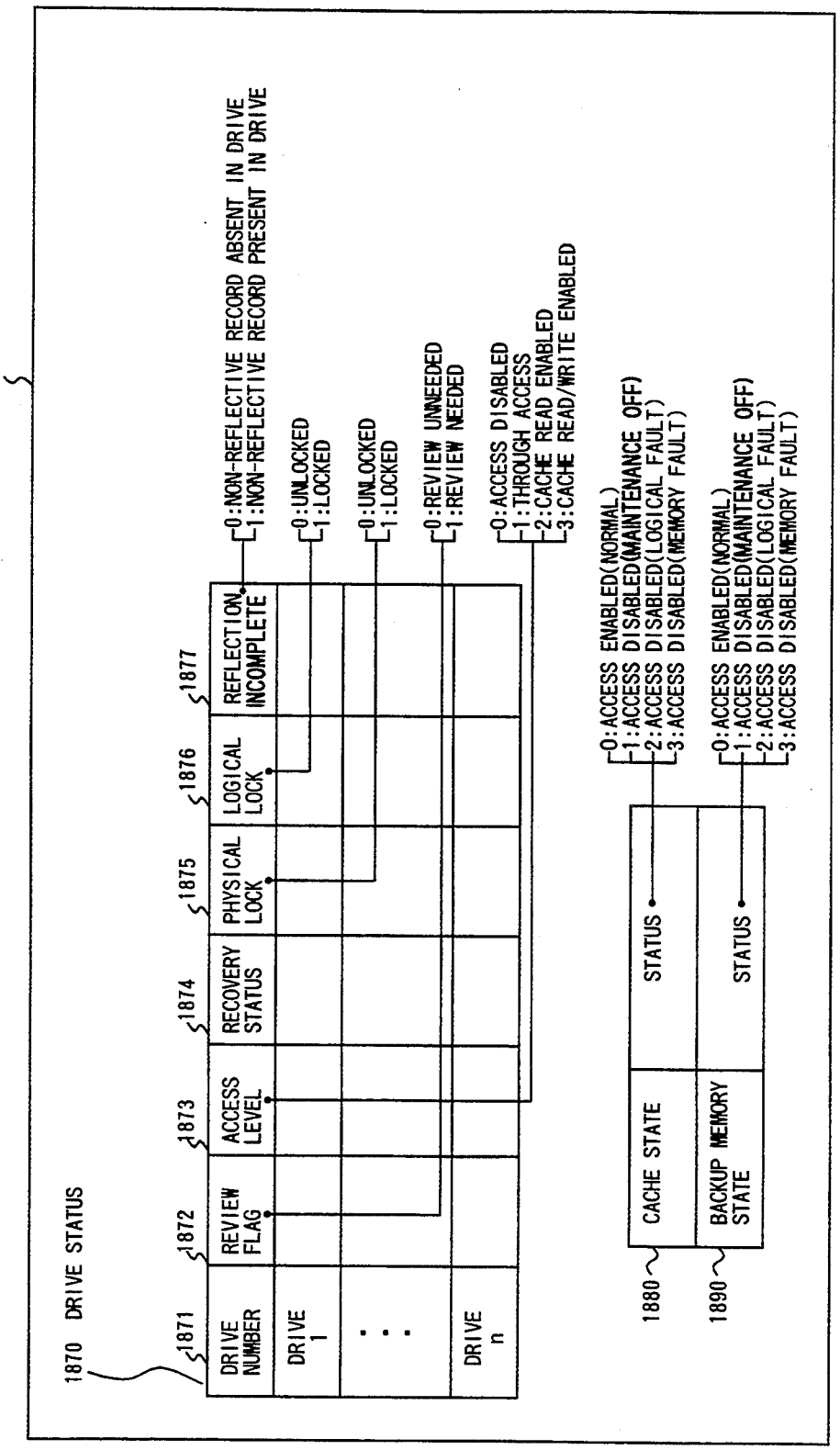
FIG. 2 is a diagram showing the status table which is a stored in the control memory shown in FIG. 1.

FIG. 2 is a diagram of status tables that are stored in the cache memory shown in FIG. 1. The tables include a drive status table 1870 which indicates the status of the disk drives, a cache status table 1880 which indicates the status of the cache memory, and a backup memory status table 1890 which indicates the status of the backup memory.

The drive status table 1870 includes the following fields. These are a drive number label 1871 for identifying the disk drive 110 or 120 (see FIG. 1), a review flag 1872 which indicates the necessity of review of the disk drive status (see FIG. 1) <"0": review unneeded; "1": review needed>, access label 1873 which indicates the possibility of access to the disk drives (see FIG. 1) <"0": access disabled; "1" through access mode for data transfer between host computer and disk drive by bypassing cache; "2": cache read enabled; "3": cache read/write enabled>, a recovery status flag 1874 which indicates the situation of recovery of the disk drive (will be explained on FIG. 3), a physical lock flag 1875 which indicates the lock status of the disk drive (see FIG. 1) <"0": unlocked; "1": locked>, a logical lock flag 1876 <"0": unlocked; "1": locked>, and a reflective record incompletion flag 1877 which indicates whether or not the disk drive (see FIG. 1) contains one-reflective records <"0": absence of non-reflective record on the disk drive; "1": presence of non-reflective record on the disk drive>.

The cache status table 1880 indicative of the status of the cache memory 106 in FIG. 1 and the backup memory status table 1890 indicative of the status of the backup memory 109 (see FIG. 1) take a value of "0", "1", "2" or "3" which represent access enabled (normal), access disabled (cutoff for maintenance), access disabled (logical fault), and access disabled (memory fault), respectively.

Figure 3:
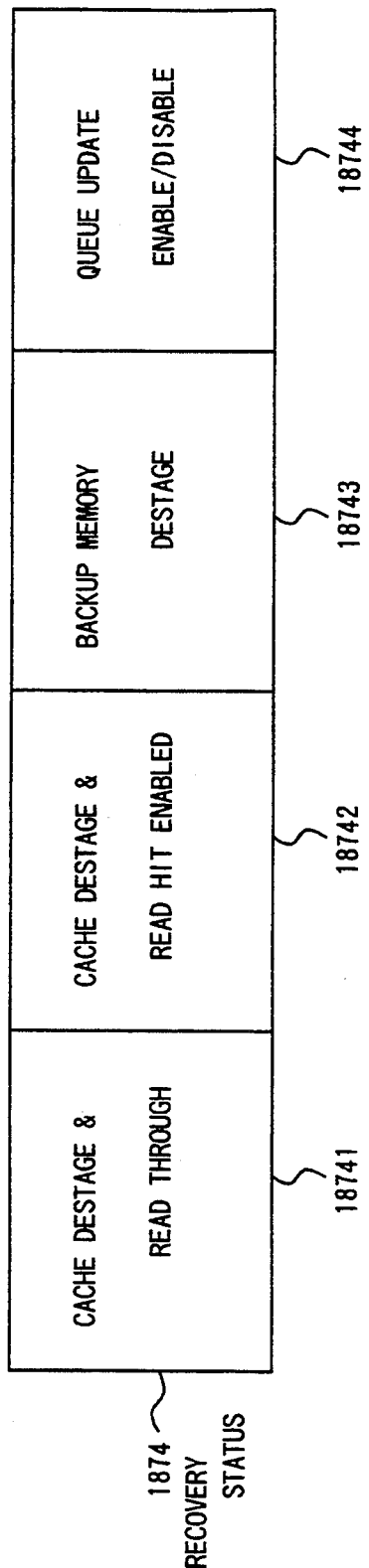
FIG. 3 is a ram showing the content of recovery status among the drive status shown in FIG. 2.

FIG. 3 is a diagram showing the content of recovery status among the disk drive status shown in FIG. 2. The recovery status includes cache destage & read through 18741, cache destage & read hit enabled 18742, backup memory destage 18743, and queue update enable/disable 18744. The states of these fields are determined from the values of the cache status table 1880 and backup memory status table 1890 shown in FIG. 2.

With the cache destage & read through flag 18741 being set "1", it implies that after non-reflective records in the cache memory 106 (see FIG. 1) are written to the relevant disk drive, the access request from the host computer 100 (see FIG. 1) to that disk drive is managed to make direct access to a physical track on that disk drive (will be termed "through access" hereinafter).

With the cache destage & read hit enabled flag 18742 being set "1", it implies that after non-reflective records in the cache memory 106 (see FIG. 1) are written to the relevant disk drive, the access request from the host computer 100 (see FIG. 1) to that disk drive is managed to take a through access for read of a track data (will be termed "slot" hereinafter) on a disk drive which does not exist in the cache memory 106 (see FIG. 1) and take through access for write to an arbitrary track on the disk drive. It also implies that a request of read access to a slot which exists in the cache memory 106 (see FIG. 1) is managed to make access to data in the cache memory 106 (see FIG. 1).

With the backup memory destage flag 18743 being set "1", it implies that non-reflective records in the backup memory 109 (see FIG. 1) are written to the relevant disk drive and the access request from the host computer 100 (see FIG. 1) is-managed to take through access.

With the queue update enable/disable flag 18744 being set "1", it implies that the vacant slot queue in the cache directory 105 (see FIG. 1), (indicating slots which do not have record yet and are not connected to a specific disk drive and track) is possibly faulty due to a logical fault and the queue operation (returning a slot control block corresponding to a slot, which has completed writing to the disk drive, to the vacant queue) should not take place.

FIG. 4 is a matrix diagram showing the determination conditions of the recovery status shown in FIG. 3. The recovery status field 1874 has its state determined from the code value of the cache status 1880 and the code value of the backup memory status 1890, shown in FIG. 2, in combination. The state is expressed by four pieces of information, the content of which has been explained in connection with FIG. 3. For example, with the cache status 1880 being "0" for enabled access (normal) and the backup memory status 1890 being "3" for disabled access (memory fault), the recovery status 1874 takes a code of "0100" and the cache destage & read hit enabled flag 18742 in FIG. 3 is set "1". Alternatively, with the cache status 1880 being "3" for disabled access (memory fault), the recovery status 1874 takes a code of "001*", and the backup memory destage flag 18743 is set "1". The symbol "*" signifies that the bit value can be any of "0" or "1". Accordingly, in case the cache memory is in fault, the process of backup memory destage will take place as far as the backup memory is normal (unless the backup memory status 1890 is "3"). As a special case, if the cache memory 106 (see FIG. 1) and the backup memory 109 (see FIG. 1) are both in fault, and the non-reflective record cannot be written to the disk drives 110 and 120 (see FIG. 1), the recovery status 1874 is set "1111".

FIG. 5 is a matrix diagram showing the determination condition for the state of access level in FIG. 2. The states of this field are determined from the code value of the cache status 1880 and the code value of the backup memory status 1890, shown in FIG. 2, in combination. For example, with the cache memory status 1880 being "2" for disabled access (logical fault) and the backup memory status 1890 being "1" for enabled access (normal), the access level takes "1" to allow through access. Alternatively, with the cache memory status 1880 and backup memory status 1890 being both "3" for disabled access (memory fault), the access level takes "0" to disable access for the drive.

FIGS. 6A and 6B are diagrams of a table showing the contents of the cache directory, cache memory, backup memory directory and backup memory shown in FIG. 1. The cache directory 105 includes a track table 1051 for the disk drive 110, a track table 1052 for the disk drive 120, and slot control blocks 350–354.

Track TR1 in the track table 1051 is linked to a slot control block 350 by a pointer, and track TRn is linked to a slot control block 351 by a pointer. Another slot control block 352 is linked to track TR1 in the track table 1052. Slot control blocks 353 and 354 are not yet linked to the track tables 1051 and 1052, and they will be linked to the track table 1051 or 1052 through the vacant slot queue 320 depending on the situation of cache operation.

Furthermore, the slot control blocks 350-354 are linked to corresponding slots of the cache memory 106 by pointers. For example, a slot control block 350 is linked to a slot 1061, a slot control block 351 is linked to a slot 1063, a slot control block 352 is linked to a slot 1062, a slot control block 353 is linked to a slot 1064, and a slot control block 354 is linked to a slot 1065.

Record R1 shown by hatching in the slot 1061 is not yet transferred to the disk drives 110 and 120 (see FIG. 1), implying that the slot 1061 is still a non-reflective slot. Similarly, the slot 1062 is also a non-reflective slot. On the other hand, for the slot 1063, all records are already transferred to the disk drives 110 and 120 (see FIG. 1), and it is a reflective slot, implying that data on the disk drives 110 and 120 reflects relevant slots data in the cache memory 106.

The following explains non-reflective slots and reflective slots in more detail. A non-reflective slot is a slot in which, in FIG. 1, data stored in the slot in the cache memory 106 does not reflect data on the physical track of a corresponding disk drive 110 or 120. In contrast, a slot, in which data stored in the slot of the cache memory 106 and data on the physical track of the corresponding track 110 or 120 are reflective, is called a reflective slot. Slots 1064 and 1065 are vacant slots, in which nothing is yet written, and they are used at the emergence of a cache process for new data.

The backup memory directory 108 includes track tables 1081 and 1082, segment control blocks 355-357 comparable to the slot control blocks, and a vacant segment queue 330. The backup memory 109 includes segments 1092-1094 and vacant segments 1095 and 1096, and these segments are linked to segment control blocks by pointers. Segments of the backup memory 109 register only non-reflective slots of the cache memory 106, and all data naturally reflect data on the disk drives 110 and 120.

Figure 7:
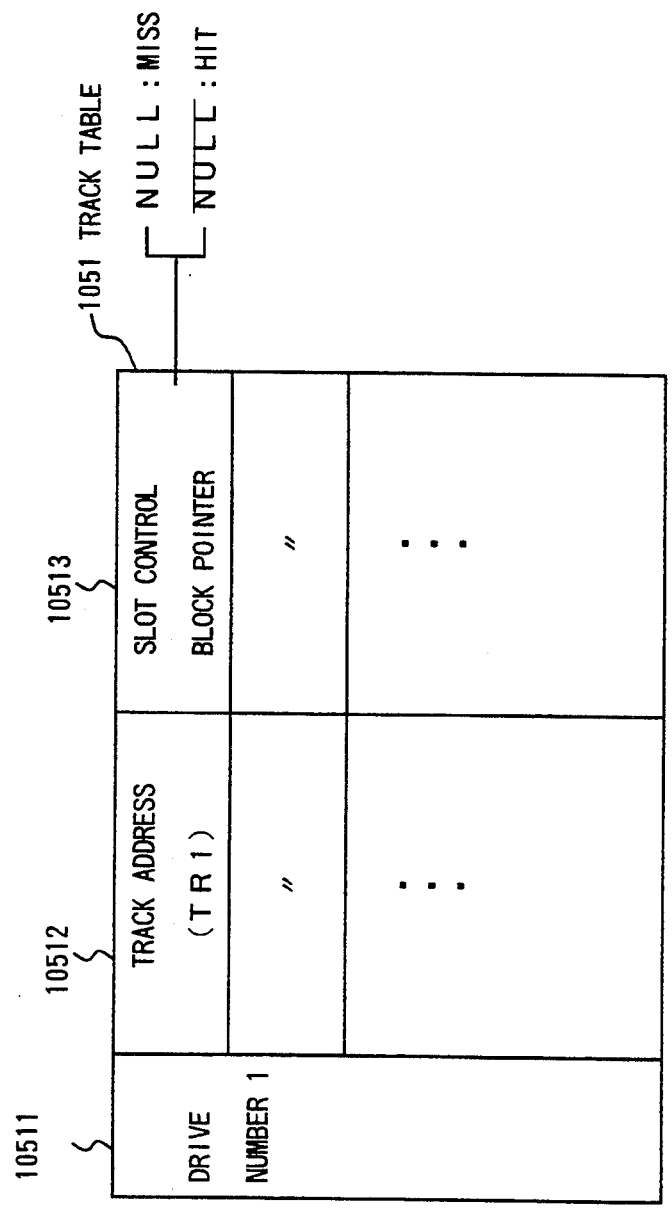
FIG. 7 is a diagram of table showing the content of registration of the track tables shown in FIGS. 6A and 6B.

FIG. 7 is a diagram of table showing the content of registration of the track table 1051 shown in FIG. 6A. The table includes fields of drive number 10511 for identifying the disk drive and track in FIG. 1, track address 10512, and pointer 10513 to the slot control blocks 350-352 in FIGS. 6A and 6B. If the slot control block pointer 10513 is "null", the pointer to the slot control block 350 is not allocated, i.e., missing, and the disk control unit 102 implements through access. On the other hand, unless the slot control block pointer 10513 is "null", a pointer is allocated to the slot control block 350 (this status is called "track hit"), and the disk control unit 102 reads the contents of the slot control block 350. This table arrangement is also applicable to the track tables 1052, 1081 and 1082 in FIGS. 6A and 6B.

Figure 8:
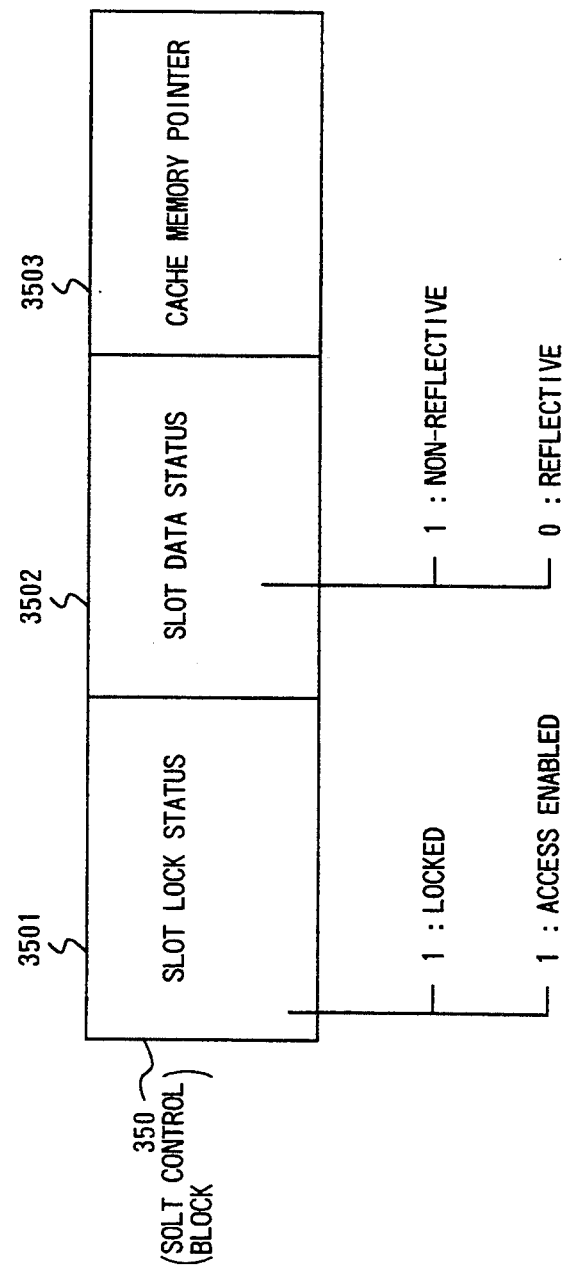
FIG. 8 is a diagram of table showing the content of registration of the slot control block shown in FIGS. 6A and 6B.

FIG. 8 is diagram of table showing the content of registration of the slot control block shown in FIG. 6A. The slot control block 350 includes fields of slot block status 3501, slot data status 3502, and pointer 3503 to the cache memory.

The slot lock status 3501 is used for the processor arbitration for the slots 1061-1063 in FIG. 6A in carrying out data transfer between the cache memory 106 and channel control unit 101 and between the cache memory 106 and disk drive 110 in FIG. 1. A status of "1" indicates that a processor locks the slot, and "0" indicates the unlocked slot.

The slot data status 3502 indicates non-reflection or reflection of the slot to the processor 103 when the access level 1873 in FIG. 2 is "3", the access request is for writing, and the specified record is hit (write hit) in the cache memory.

Figure 9:
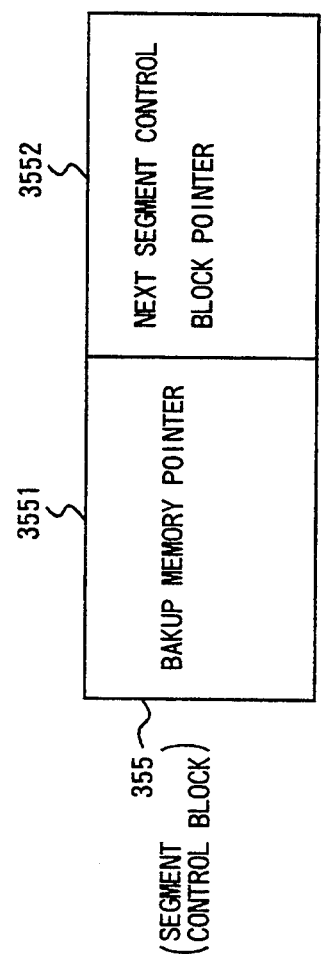
FIG. 9 is a diagram of table showing the content of registration of the segment control block shown in FIGS. 6A and 6B.

FIG. 9 is a diagram of table showing the content of registration of the segment control block shown in FIG. 6B. The segment control block 355 includes fields of backup memory pointer 3551 and next segment control block pointer 3552.

In FIG. 6B, track TR1 in the track table 1081 is linked to a segment 1092 of the backup memory 109 by the backup memory pointer 3551. Similarly, in FIG. 6B, a segment control block 356 is linked to a segment 1093 by the backup memory pointer and further linked to a segment control block 357 by a pointer having the same function as the next segment control block pointer 3552, and a segment control block 357 is linked to a segment 1094 by the backup memory pointer. In this manner, the track tables 1081 and 1082 in FIG. 6B are linked to segments of the backup memory 109 by the segment control blocks shown in FIG. 9.

The operation of the disk control unit 102 shown in FIG. 1 will be explained in detail in connection with the tables shown in FIGS. 2 through 9.

The first case is the normal operation of the cache memory and backup memory in FIG. 1. The processor 103 in the disk control unit 102 receives an access request from the host computer 100 by way of the channel control unit 101, and it analyzes the request to find the disk drive to be accessed. It is assumed that the request is writing of record 1 on track 1 of the disk drive 110. The processor issues a lock request for updating the control memory 187 over the signal line 126 to the lock mechanism 107. The lock mechanism 107 is a sort of arbiter circuit operating on a hardware basis to implement the exclusive control so that the processors 103 and 104 update exclusively the control memory 187, cache directory 105 and directory 108.

In response to the report of successful lock of the control memory 187 over the signal line 126, the processor 103 sets "1" to the logical lock 1876 (see FIG. 2) of the relevant disk drive in the drive status table 1870 (see FIG. 2) in the control memory 187. After that, the lock mechanism 107 unlocks the control memory 187. The logical lock 1876 in FIG. 2 is intended to arbitrate processors on disk drives in making access to data in the cache memory.

Subsequently, the disk control unit 102 checks the access level 1873 (see FIG. 2) of the pertinent disk drive in the drive status table 1870 in FIG. 2. The access level 1873 in FIG. 2 has values "0" through "3" for specifying the process of the drive access request from the channel control unit 101 when the recovery status 1874 (see FIG. 2) has value "0000". With the access level being "0", indicating the disk drive to be access disabled, an error report is returned to the channel control unit 101.

With the access level 1873 in FIG. 2 being "non-zero", the following processes take place.

The disk control unit 102 receives a command from the channel control unit 101, and the processor 103 analyzes the command to identify the read/write mode (a write command is assumed), access track number TR1 and record number R1. If the access level 1873 of FIG. 2 is "1", "1" is set to the physical lock 1875 (see FIG. 2) of the disk drive status table 1870 (see FIG. 2) of the pertinent disk drive. The physical lock 1875 of FIG. 2 is intended to arbitrate processors in accessing data on a disk drive. After that, the specified record on the physical track of the disk drive is accessed directly, i.e., through access.

If the access level 1873 of FIG. 2 is "2" or "3", the processor 103 searches the track table 1051 for the disk drive 110 in the cache directory 105 (see FIGS. 6A and 7), and checks whether or not a cache slot 1061 (see FIG. 6A) for the track TR1 is already allocated in the cache memory 106. Specifically, the processor examines whether or not a pointer to the slot control block 350 (see FIGS. 6A and 8) is allocated to the slot control block pointer 10513 of the track address 10512 (TR1) in the track table 1051. Unless the slot control block pointer 10513 of FIG. 7 is "null", a pointer to the slot control block 350 (see FIG. 6A) is allocated. This status is called "track hit". Track hit is assumed in the following. Consequently, the processor 103 checks the slot lock status 3501 in the slot control block 350 of FIG. 8 to see whether or not the pertinent slot is locked (slot lock status 3501 being "1") by another processor. The slot lock status 3501 of FIG. 8 is intended to arbitrate processors for the slots 1061 and 1063 in FIG. 6A for transferring data between cache memory 106 and channel control unit 101 and between the cache memory 106 and disk drive 110. It is assumed that the slot is not locked by another processor (slot lock status 3501 in FIG. 8 being "0").

The processor 103 rewrites the slot lock status 3501 of the slot control block 350 in FIG. 8 to "1" indicative of "locked". Subsequently, the processor 103 reads the cache pointer 3503 (see FIG. 8), which is placed for the slot 1061 in the data storage area in the cache memory 106, out of the slot control block 350, and searches for the storage location of the record R1 in that slot 1061.

With the access level 1873 of FIG. 2 being "2", when the access request is reading, a hit record in the cache memory is read out and transferred to the channel control unit 101, or when the access request is reading and at the same time the specified record is missing in the cache memory, or when the access request is writing, through access is implemented.

After the through access, a slot control block which points unused (i.e., not linked to the track tables 1051 and 1052 in FIG. 6A) vacant slots 1064 and 1065 (see FIG. 6A) is taken out of the vacant slot queue 320 (see FIG. 6A) in the cache directory 105, e.g., the vacant slot control block 353, and data on the track of through access is loaded from the disk drive 110 to the vacant slot 1064 in the cache memory 106.

With the access level 1873 of FIG. 2 being "3", when the access request from the host computer 100 is writing and the specified record is hit (write hit) in the cache memory 106, the following process take place.

The process 103 examines the slot data status 3502 (see FIG. 8) of the slot control block 350 (see FIG. 8) which has hit and knows that it is "1", i.e., non-reflective slot. In the case of write hit to a non-reflective slot, the track table 1081 of the same disk drive in the directory 108 of the backup memory 109 in FIG. 6B is examined thereby to have a pointer to the slot control block 355, and based on the backup memory pointer 3551 of the slot control block 355 in FIG. 9, the data storage location in the backup memory 109 is given.

In the case of write hit to a reflective slot, a minimum number of slot control blocks 358 and 359 (see FIG. 6B) in need are taken out of the vacant slot queue 330 (see FIG. 6B) thereby to make a memory area for storing write data to the cache memory 106, and they are linked by the next slot control block pointer 3532 (see FIG. 9) of the slot control block so that they are linked to the pertinent slots 1095 and 1096 (see FIG. 6B) in the backup memory directory 108.

Following these operations the processor 103 requests the channel control unit 101 to transfer write record data from the host computer 100. The processor 103 transfers the write data from the host computer 100 to the field of record R1 in the cache slot 1061 (see FIG. 6A) and the field of record R1 in the slot 1092 (see FIG. 6B) in the backup memory 109 simultaneously by way of the channel control unit 101. Furthermore, the processor 103 sets "1" to the slot data status 3502 (see FIG. 8) of the slot control block 350 in the cache directory 105.

On completion of transfer of the record R1 data to the cache memory 106 and backup memory 109, the end of data writing to the disk drive 110 is reported to the channel control unit 101. As a result, in the case of write hit, write data is held as a non-reflective slot in duplicate in the cache memory 106 and backup memory 109.

After a certain number of such non-reflective slots have been accumulated in the disk control unit 102, a processor which does not deal with the access request from the channel control unit 101 (e.g., processor 104) writes several tracks in batch on the pertinent disk drive 110 or 120, and returns the slot control blocks 355–357 (see FIG. 6B) in the backup memory 109 to the vacant slot queue 330 (see FIG. 6B). This operation is called "batch writing". These are the operation of the disk control unit 102 in the normal state.

In the disk control unit 102 which operates as described above, if one of the cache memory 106 and backup memory 109 develops an access fault, non-reflective slots become unilateral (not duplicated) in the disk control unit 102, and this is not desirable for the data safety. Therefore, in this event, it is necessary as a fault handling process to write unilateral non-reflective slots onto the corresponding physical tracks, of the disk drives 110 and 120.

Figure 10:
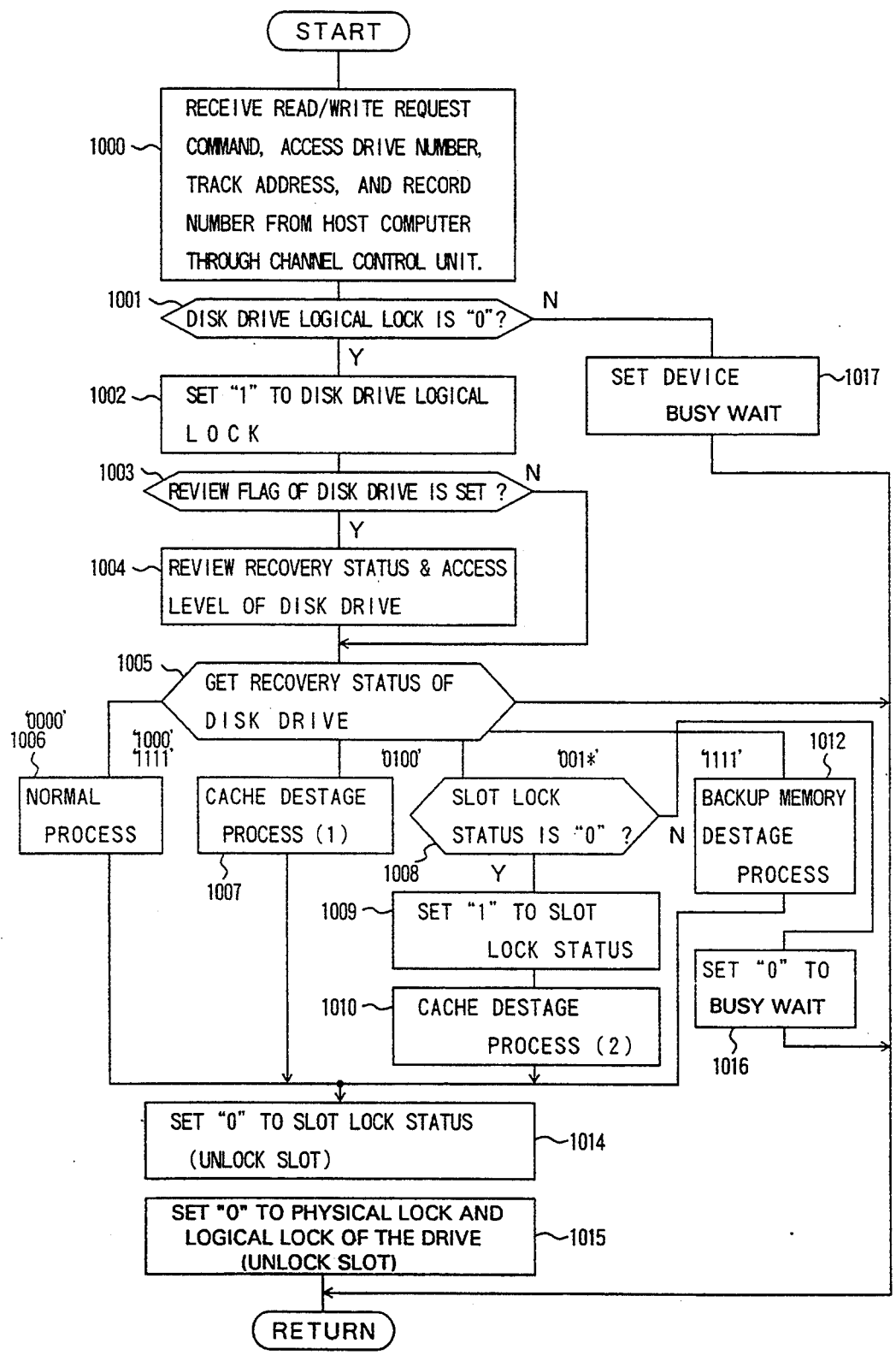
FIG. 10 is a flowchart showing the process of the disk drive access request implemented by the disk control unit shown in FIG. 1.

The following explains the operation of the disk control unit 102 at the occurrence of a memory fault. FIG. 10 is a flowchart showing the operation of the disk control unit shown in FIG. 1.

Steps 1000–1002 are for the reception of an access request from the channel control unit 101 and the resulting logical lock process for the pertinent disk drive 110 or 120 (see FIG. 1) in the normal state as described above.

If the step 1001 fails in logical lock, a retry request is returned to the channel control unit 101 as a device busy status (step 1017). If logical lock is successful (step 1002), it is tested whether or not the review flag 1872 (see FIG. 2) of the drive status table 1870 (see FIG. 2) is set (step 1003). If the flag is found set, the recovery status and access level are reviewed for the pertinent disk drive (step 1004).

Figure 11:
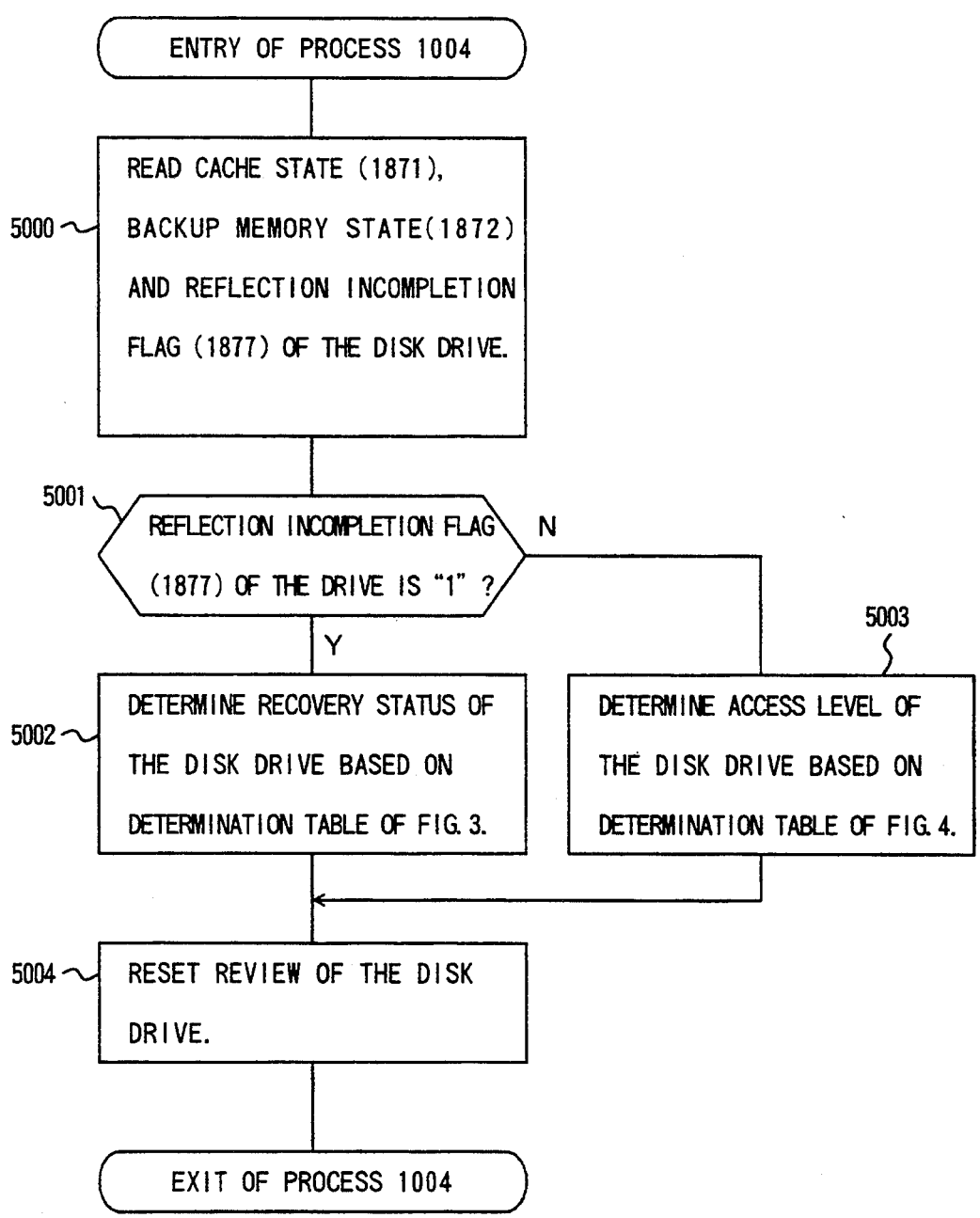
FIG. 11 is a flowchart showing the review process for the recovery status and access level implemented by the disk control unit shown in FIG. 1.

The following explains the details of the review process for the recovery status and access level (step 1004) on FIG. 11. FIG. 11 is a flowchart showing the review operation for the recovery status and access level of the disk control unit shown in FIG. 1.

Initially, the cache status 1880 (see FIG. 2) and backup memory status 1890 (see FIG. 2) in the control memory 187 (see FIGS. 1 and 2) are read out, and the reflection incomplete flag 1877 (see FIG. 2) pertinent to the accessed disk drive is read out of the drive status table 1870 (see FIG. 2) (step 5000). The cache status 1880 (see FIG. 2) has status codes, in which "0" indicates normal access enabled, "1" indicates access disabled due to maintenance activity, "2" indicates access disabled due to a logical fault in directory information, and "3" indicates access disabled due to a hardware fault in memory.

The above code definition is equally applicable to the backup memory status 1890 (see FIG. 2). The logical fault of directory information mentioned above is a processor fault for example, and it corresponds to such a case as the unsuccessful completion of operation of the vacant slot queue 320 in the cache directory in FIG. 6B.

Next, when the reflection incompletion flag 1877 (see FIG. 2) of the disk drive is "1", it implies that non-reflective record data in the cache memory or backup memory for the pertinent disk drive is possibly not yet written to the disk drive. When the reflection incompletion flag of the disk drive is "0", it implies that non-reflective record data of the pertinent disk drive does not exist in the cache memory or backup memory for the disk drive.

With the reflection incompletion flag 1877 (see FIG. 2) being "1", the recovery status 1874 (see FIG. 2) of the pertinent disk drive is determined in accordance with the determination table shown in FIG. 4 (step 5002). Furthermore, the access level 1873 (see FIG. 2) of the pertinent disk drive is determined in accordance with the determination table shown in FIG. 5 (step 5003).

After the recovery level or access level has been determined in this manner, the review flag of the pertinent disk drive is reset (step 5004). These are the review operation for the recovery status and access level.

Returning to the flowchart of FIG. 10, the discrimination process for the content of recovery status (steps headed by 1005) will be explained. When the recovery status is "0000", the access request is processed based on the method of the foregoing normal process (step 1006). When the recovery status is "1000" or "1001", the cache destage process (1) which will be explained later is carried out (step 1007). When the recovery status is "0100", lock of the pertinent slot is made (step 1008), and after locking (step 1009), the cache destage process (2) which will be explained later is carried out (step 1010). When the recovery status is "001*" (* can be either "1" or "0"), the backup memory destage process which will be explained later is carried out (step 1012). The pertinent slot lock status is clear to zero (step 1014), the physical lock and logical lock of the pertinent disk drive are cleared to zero (step 1015), and the process completes.

The following explains the details of the cache destage process (1) (step 1007), cache destage process (2) (step 1010), and backup memory destage process (step 1012) in this order.

Figure 12:
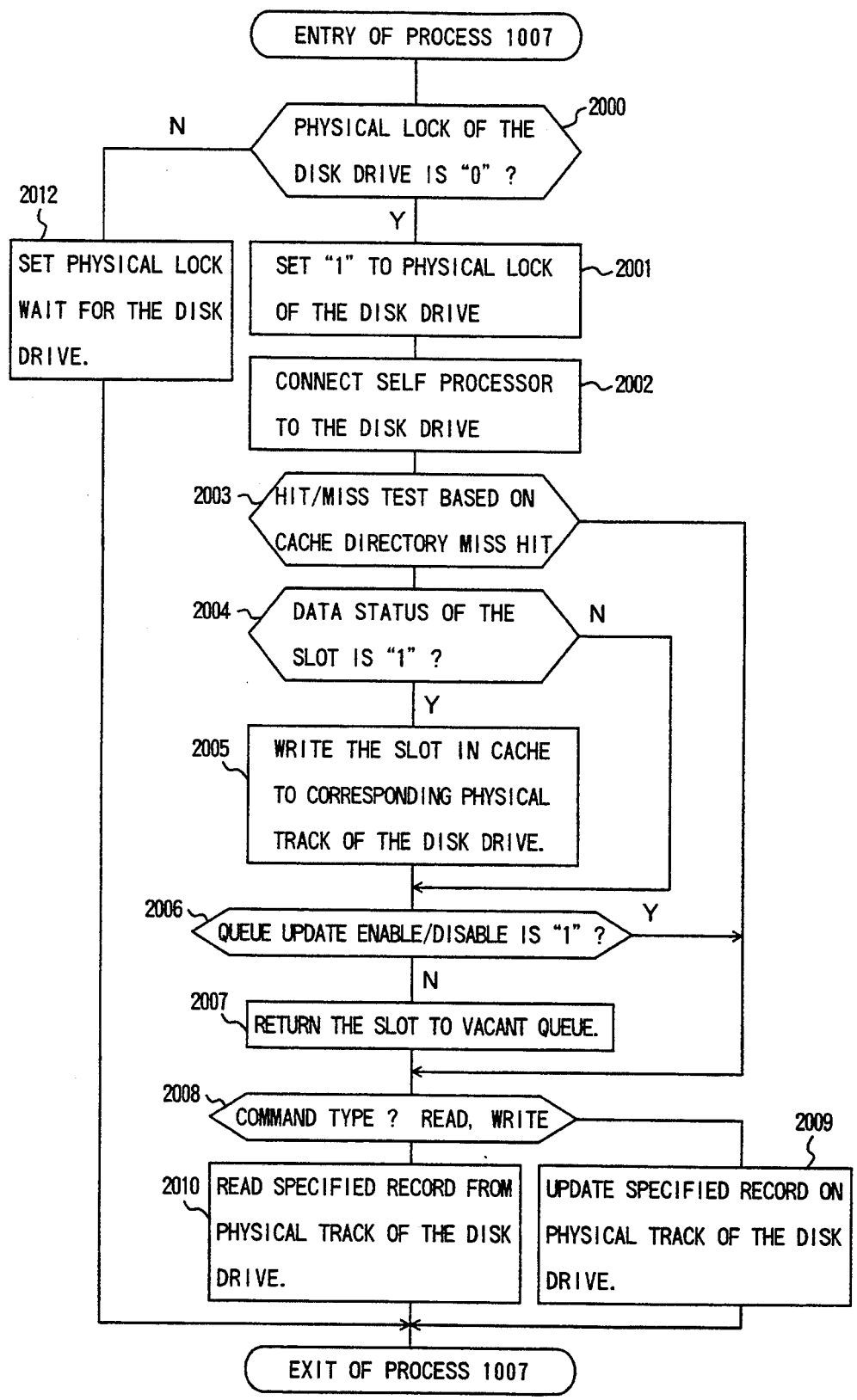
FIG. 12 is a flowchart showing the operation of the cache destage process (1) of the disk control unit shown in FIG. 1.

FIG. 12 is a flowchart showing the operation of the cache destage process (1) of the disk control unit shown in FIG. 1.

Initially, physical lock of the pertinent disk drive is made (step 2000), and if lock is unsuccessful, the physical lock wait is set (step 2012) to terminate the process. Following the successful physical lock, the physical lock of the pertinent disk drive is set "1" (step 2001), the processor which has received the access request from the channel control unit is connected to the pertinent disk drive (step 2002), and the foregoing hit/miss judgement is conducted by using the cache directory (step 2003).

In the case of hit, the slot data status which is set in the slot control block of the pertinent slot is referenced thereby to judge whether or not it is a non-reflective slot (step 2004). If it is found to be a non-reflective slot, the slot is read out of the cache memory and written to the corresponding physical track of the pertinent disk drive (step 2005), and thereafter the queue update enable/disable 18744 (see FIG. 3) of the recovery status is judged. Only in the case of enabled updating, the slot control block of the slot which has been written to the disk drive is returned to the vacant queue 320 (see FIG. 6A) (step 2007).

The type of the command received from the channel control unit 101 is analyzed (step 2008). In the case of a read command, the specified record is read from the physical track of the pertinent disk drive (step 2010), or if it is a write command, the specified record is written to the physical track of the pertinent disk drive (step 2009). These are the operation of the cache destage process (1).

Figure 13:
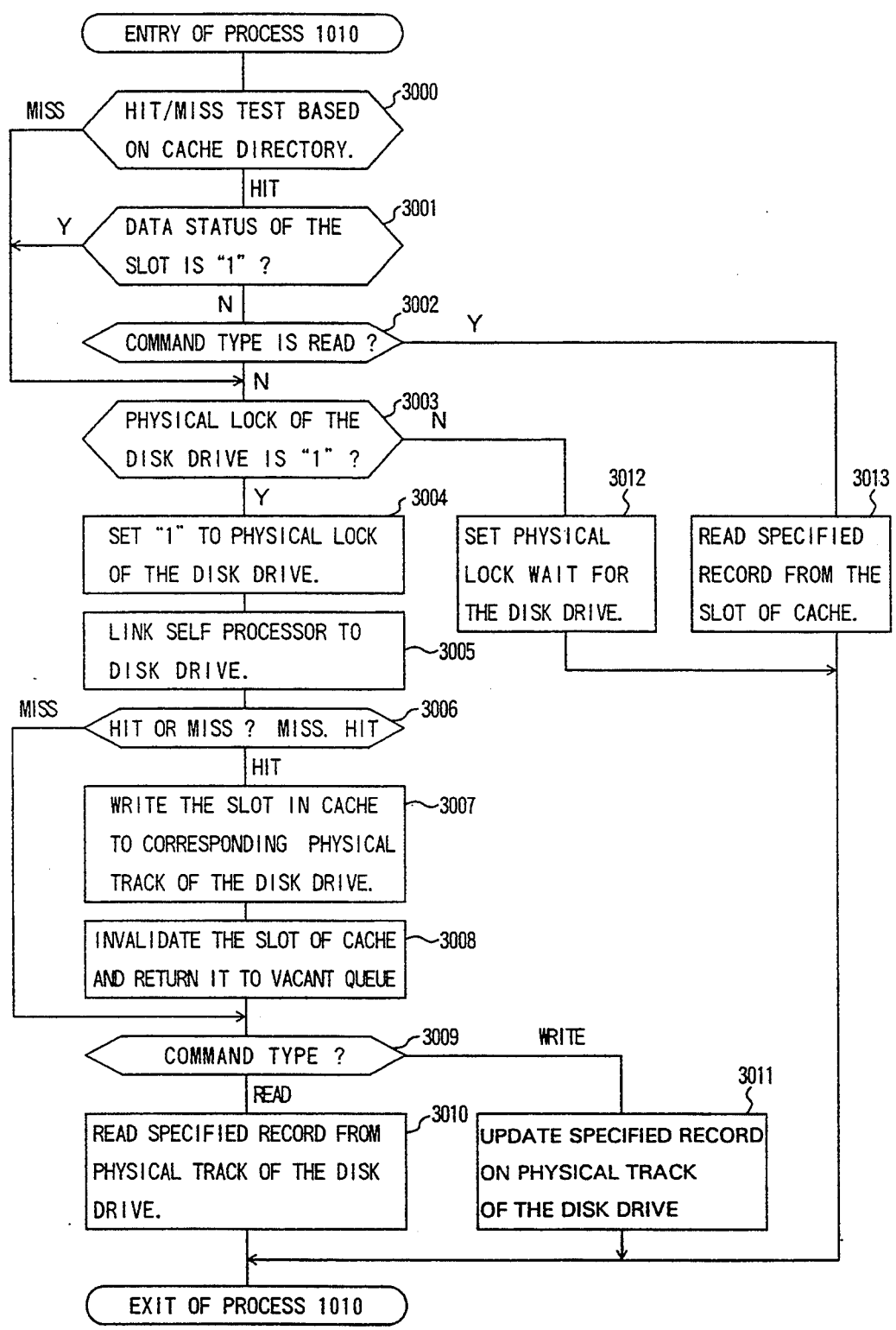
FIG. 13 is a flowchart showing the operation of the cache destage process (2) of the disk control unit shown in FIG. 1.

FIG. 13 is a flowchart showing the operation of the cache destage process (2) of the disk control unit shown in FIG. 1.

Initially, the foregoing hit/miss judgement is conducted by using the cache directory 105 (see FIG. 1) (step 3000). In the case of hit, the slot data status which is set in the slot control block of the pertinent slot is referenced thereby to judge whether or not it is a non-reflective slot (step 3001). If it is found to be a reflective slot, the type of the command received from the channel control unit 101 (see FIG. 1) is analyzed (step 3002). In the case of a read command, the specified record is read from the pertinent slot in the cache memory (step 3013) to terminate the process. If it is found to be a non-reflective slot, physical lock is made for the pertinent disk drive (step 3003). If lock is unsuccessful, the physical lock wait is set (step 3012) to terminate the process. If lock is successful (step 3004), the processor which has received the access request from the channel control unit 101 (see FIG. 1) is connected to the pertinent disk drive (step 3005), and the hit/miss judgement based on the cache directory 105 (see FIG. 1) is conducted again (step 3006). In the case of hit, the slot is read out of the cache memory and written to the corresponding physical track of the pertinent disk drive (step 3007), and thereafter the slot control block of the slot which has been written to the disk drive is returned to the vacant queue 320 (see FIG. 6A) (step 3008).

In the case of a write command received from the channel control unit 101, the specified record is written to the physical track of the pertinent disk drive (step 3011), or in the case of a read command, the specified record is read from the physical track of the pertinent disk drive (step 3010). These are the operations of the cache destage process (2).

Next, the operation of the backup memory destage process of step 1012 will be explained.

Figure 14:
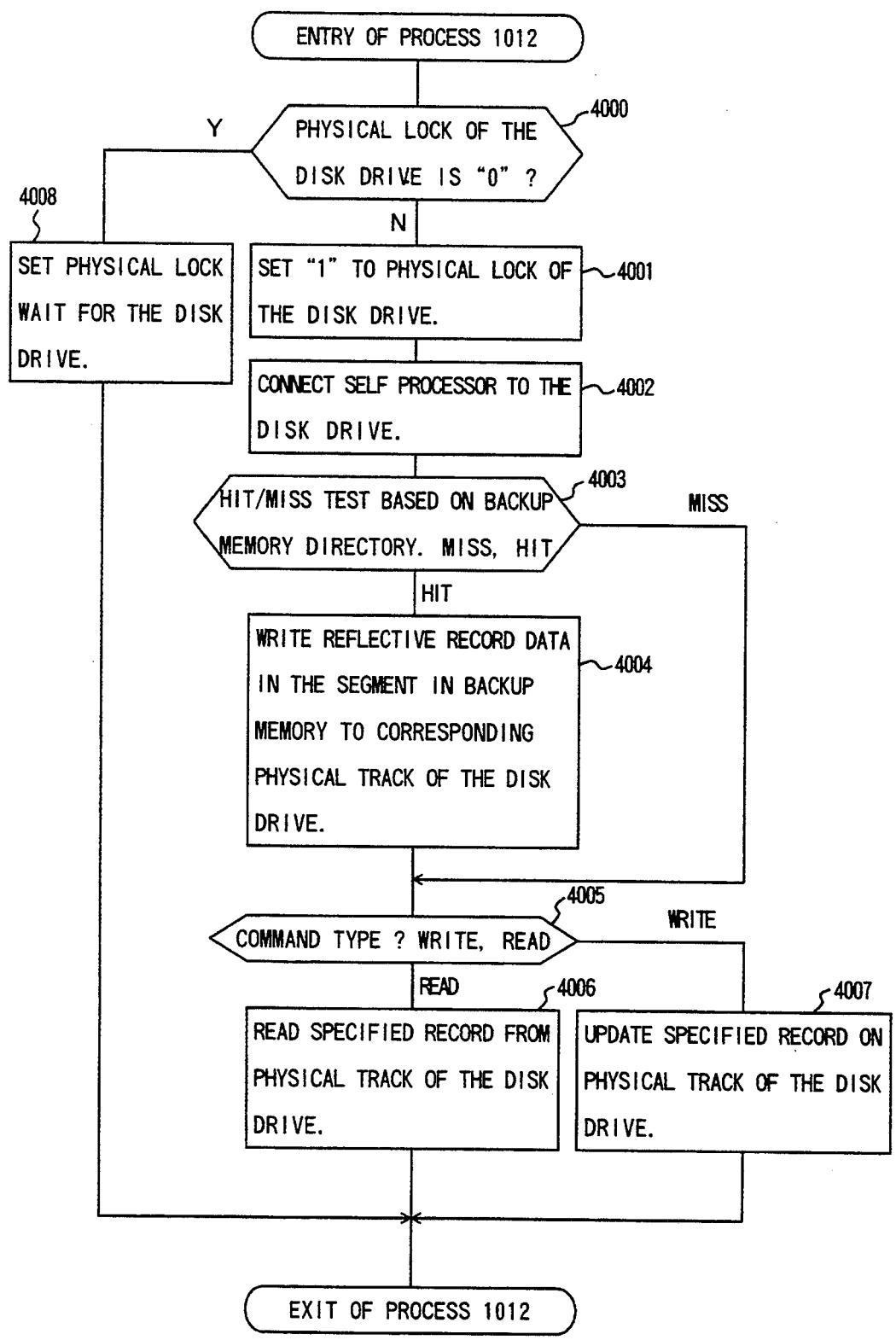
FIG. 14 is a flowchart showing the operation of the backup memory destage process of the disk control unit shown in FIG. 1.

FIG. 14 is a flowchart showing the operation of the backup memory destage process of the disk control unit shown in FIG. 1.

Initially, physical lock of the pertinent disk drive is made (step 4000), and if lock is unsuccessful, the physical lock wait is set (step 4008) to terminate the process. Following the successful lock (step 4001), the processor which has received the access request from the channel control unit 101 is connected to the pertinent disk drive (step 4002), and the foregoing hit/miss judgement is conducted by using the backup memory directory (step 4003).

In the case of hit, the non-reflective record in the pertinent segment is read out of the backup memory 109 (see FIG. 1) and written to the corresponding physical track of the pertinent disk drive (step 4004), and thereafter the type of the command received from the channel control unit 101 is analyzed (step 4005). If the step 4005 has revealed a read command, the specified record is read from the physical track of the pertinent disk drive (step 4006), or if it is a write command, the specified record is written to the physical track of the pertinent disk drive (step 4007). These are the operations of the backup memory destage process.

All of the foregoing processes write non-reflective records in the disk control unit 102 (see FIG. 1) to a disk drive in response to the reception of a command from the channel control unit 101 (see FIG. 1). However, for the data security, it is necessary to write non-reflective records in the disk control unit 102 (see FIG. 1) to a disk drive even in the absence of command from the channel control unit 101 (see FIG. 1). For this accomplishment, the processors 103 and 104 in the disk control unit 102 in FIG. 1 implement autonomously the non-reflective record search and write operation.

Figure 15:
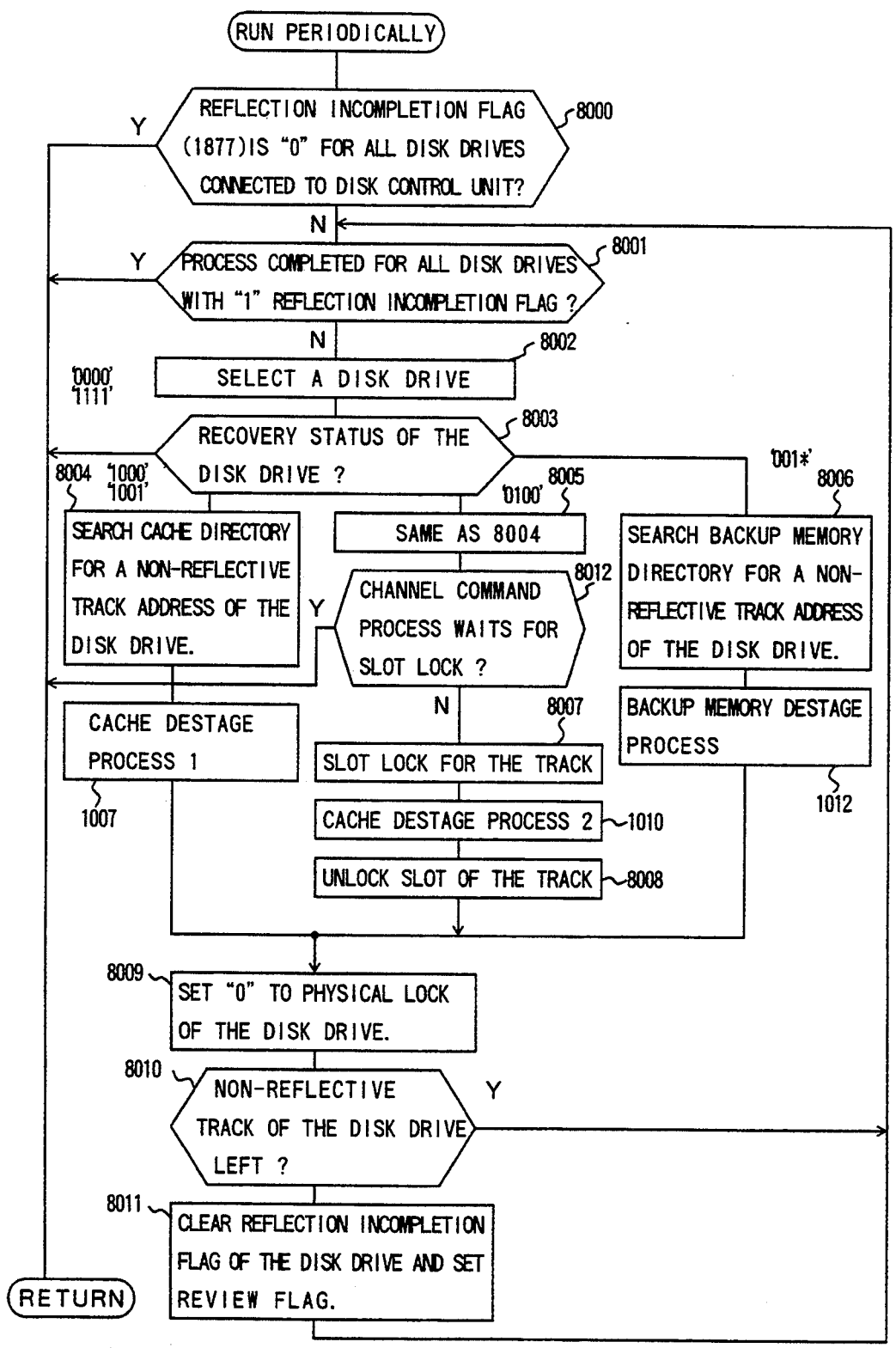
FIG. 15 is a flowchart showing the operation of the non-reflective record search and write process implemented by the disk control unit shown in FIG. 1.

FIG. 15 is a flowchart showing the operation of the non-reflective record search and write process of the disk control unit shown in FIG. 1.

Initially, it is tested for all disk drives connected to the disk control unit 102 as to whether or not the reflection incompletion flag 1877 (see FIG. 2) in the drive status table 1870 (see FIG. 2) is "0" (step 8000). For disk drives with "non-zero" status, the recovery status 1874 (see FIG. 2) is tested individually (step 8003), and any of the following processes is carried out depending on the value.

With the recovery status being "0000" or "1111", the process terminates without doing anything. With the recovery status being "1000" or "1001", the cache directory 105 (see FIG. 2) is searched for a non-reflective track address of the pertinent disk drive (step 8004), and the foregoing cache destage process (1) is implemented for that track. With the recovery status being "0100", the cache directory 105 (see FIG. 2) is searched for a non-reflective track address of the pertinent disk drive (step 8005), and it is locked (step 8007). In this case, it is tested as to whether or not the channel command process explained on FIG. 10 is waiting for the lock of the pertinent slot (step 8012). If the channel command process waits for lock, the process terminates without doing anything, or if the channel command process does not wait for lock, the pertinent track is rendered the slot lock and the foregoing cache destage process (2) is implemented.

With the recovery status being "001*", the backup memory directory 108 (see FIG. 1) is searched for a non-reflective track address of the pertinent disk drive (step 8006), and the foregoing backup memory destage process is implemented for that track.

After that, the lock status of the pertinent slot is cleared to zero (step 8008), and the physical lock of the pertinent disk drive is cleared to zero (step 8009). It is tested as to whether or not any non-reflective track is left (step 8010), and if it is found absent, the reflection incompletion flag of the pertinent disk drive is cleared to zero and the review flag is set "1" (step 8011).

These operations are repeated for all disk drives connected to the disk control unit 102 (see FIG. 1) at a certain interval until the reflection incompletion flag in the disk drive status table 1870 (see FIG. 2) becomes zero. These are the operation of the non-reflective record search and write process.

In the foregoing embodiment, through the channel command process at the occurrence of fault shown in FIG. 10, it is possible to write a non-reflective track in the disk control unit 102 to a disk drive safely in response to the reception of an access request from the host computer 100 by way of the channel control unit 101 and in parallel to the channel command process.

Furthermore, through the implementation of the non-reflective track search and destage process shown in FIG. 15 in parallel to the channel command process at a fault shown in FIG. 10 under the multiprocessor environment, it is possible to write a non-reflective track in the disk control unit 102 safely to a disk drive even if the disk drive is not accessed by the host computer 100.

Although in this embodiment the non-reflective record search and write process searches for a single non-reflective track in the cache directory 105 or backup memory directory 108, the number of tracks to be searched may be variable depending on the frequency of access request from the channel control unit 101 to the disk control unit 102.

Although in this embodiment, in the process of access request from the channel control unit 101, a non-reflective track is written to a disk drive and thereafter data is written to the disk drive, an alternative manner if there is a non-reflective track in the cache memory 106 is to render the write data from the channel control unit 101 reflective in a slot of the cache memory 106 and thereafter render the slot reflective on the disk drive.

Moreover, in the write operation for a non-reflective segment in the backup memory to a disk drive, such as in the backup memory destage process, a lock means in units of disk drive may be provided in place of a lock means in units of track thereby to implement the trackwise sequential writing, in order to reduce the capacity of backup memory and the overhead of memory management in the normal state.

According to this embodiment, as described above, in the event of a fault in the cache memory, backup memory or processor in the disk control unit, which creates the unilateral condition of non-reflective data in the disk control unit due to disabled access to the cache memory or backup memory, it is possible to write the non-reflective data safely and promptly to a disk drive while processing an access request from the channel control unit to the disk drive, whereby the reliability of the batch write operation by the disk control unit can be enhanced.

This invention enables non-reflective data in the cache to be written to a disk drive without using the disk drive exclusively at the occurrence of a fault in the cache, whereby the reliability and operationability of the system can be enhanced.

We claim:

1. A method of fault handling for a disk control unit with built-in cache which is connected with a capacious disk drive and a host computer, and having a cache memory and a backup memory for backing up said cache memory, said control unit operating in response to a write command for data from said host computer to said disk drive to write the data to both of said cache memory and said backup memory, and implementing a write operation from said backup memory to said disk drive asynchronously with the write operation of said write command, said method comprising:

a step of detecting a fault of reading or writing in one of said cache memory and backup memory; and a step of judging whether track data stored in said cache memory and backup memory is non-reflective data that has not yet been written to said disk drive, and judging whether or not a track of said disk drive is a non-reflective track which is different in data content from data stored in said cache memory and backup memory;

said method, upon receiving a read or write command from said host computer which involves access to a track of said disk drive, and upon detecting a fault in one of said cache memory and backup memory by said fault detection step, and further upon judging that said track is a non-reflective track in said non-reflective track judgment step, writing the non-reflective track data which resides in the other one of said cache memory and backup memory to said track of said disk drive, and, on completion of the non-reflective track data write operation to said disk drive, executing the read or write command from said host computer for said track of said disk drive; and implementing a track-wise lock for non-reflective tracks in a normal memory which is accessed by a read or write command from said host computer, and a step of implementing a drive-wise lock for a disk drive to which said non-reflective tracks are written, said method including a step of implementing, during a period from the commencement of a write operation to said disk drive upon detecting the non-reflective tracks until the completion thereof, the track-wise lock and drive-wise lock for locking tracks and a disk drive pertinent to said operation, and unlocking said tracks and disk drive on completion of the write operation to said disk drive.

2. A method of fault handling for a disk control unit with built-in cache according to claim 1, wherein upon detecting in said fault detection step that said one of said cache memory and backup memory has a fault of reading or writing, the non-reflective track resulting from the judgment by said non-reflective track judgment step of difference in data between said cache memory or backup memory and said disk drive is written to said track of said disk drive regardless of whether a read or write command is received from said host computer.

3. A method of fault handling for a disk control unit with built-in cache according to claim 1, wherein in case said back-up memory is normal, said track lock step implements the drive-wise lock at the write operation for a non-reflective track in said backup memory to a track of the disk drive.

4. A method of fault handling for a disk control unit with built-in cache according to claim 1, wherein a read or write command from said host computer, which involves access to a normal one of said memories, is executed only for said normal memory, instead of being executed for the track of said disk drive.

* * * * *